United States Patent
Barnette et al.

(10) Patent No.: US 9,618,539 B2
(45) Date of Patent: Apr. 11, 2017

(54) SENSING CURRENT OF A DC-DC CONVERTER

(71) Applicant: LENOVO ENTERPRISE SOLUTIONS (SINGAPORE) PTE. LTD., Singapore (SG)

(72) Inventors: Jamaica L. Barnette, Durham, NC (US); Douglas I. Evans, Cary, NC (US); Brian C. Totten, Durham, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 138 days.

(21) Appl. No.: 14/723,769

(22) Filed: May 28, 2015

(65) Prior Publication Data

US 2016/0349288 A1    Dec. 1, 2016

(51) Int. Cl.
*G01R 19/00* (2006.01)
*G01R 15/14* (2006.01)

(52) U.S. Cl.
CPC ....... *G01R 15/146* (2013.01); *G01R 19/0092* (2013.01)

(58) Field of Classification Search
None
See application file for complete search history.

(56) References Cited

U.S. PATENT DOCUMENTS

| | | |
|---|---|---|
| 3,239,798 A | 3/1966 | Silver |
| 3,969,752 A | 7/1976 | Martin et al. |
| 4,139,935 A | 2/1979 | Bertin et al. |

(Continued)

FOREIGN PATENT DOCUMENTS

| | | |
|---|---|---|
| GB | 2484010 A | 3/2012 |
| JP | 55-111664 | 8/1980 |

(Continued)

OTHER PUBLICATIONS

Padiyar, U.H., et al., "A System Level Solution to Improve VRM Efficiency", IEEE International Conference on Industrial Technology, Feb. 10-13, 2009, pp. 1-5, IEEE, USA, Digital Object Identifier: 10.1109/ICIT.2009.4939661.

(Continued)

*Primary Examiner* — Paresh Patel

(74) *Attorney, Agent, or Firm* — Brandon C. Kennedy; Douglas W. Robinson; Kennedy Lenart Spraggins LLP

(57) ABSTRACT

A DC-DC converter includes a directly coupled inductor with coil elements and power-switching phases. Each phase includes a high-side and low-side switch, where the high-side switch couples a voltage source to a coil element and the low-side switch couples the coil element to a ground voltage. Each switch is configured to be alternately activated and no two switches are activated at the same time. A current sensor for the DC-DC converter includes a single current amplifier having inputs and an output. The output provides a current sensing signal. The current sensor also includes a single RC network coupled to one of the power-switching phases and a first input of the current amplifier. The current sensor also includes a resistive ladder. The ladder includes, for each of the other power-switching phases, a resistor coupled in parallel to the RC network resistor and to a second input of the current amplifier.

12 Claims, 8 Drawing Sheets

Identity Switching DC-DC Converter With Current Sensing 700

(56) References Cited

U.S. PATENT DOCUMENTS

| | | | |
|---|---|---|---|
| 4,193,083 A | 3/1980 | Max |
| 4,232,254 A | 11/1980 | Haferl |
| 4,447,866 A | 5/1984 | Reeves |
| 4,581,693 A | 4/1986 | Ueda |
| 4,615,000 A | 9/1986 | Fujii |
| 4,720,667 A | 1/1988 | Lee et al. |
| 4,720,668 A | 1/1988 | Lee et al. |
| 4,785,387 A | 11/1988 | Lee et al. |
| 4,841,220 A | 6/1989 | Tabisz et al. |
| 4,851,769 A | 7/1989 | Carpenter et al. |
| 4,857,822 A | 8/1989 | Tabisz et al. |
| 4,860,184 A | 8/1989 | Tabisz et al. |
| 4,866,367 A | 9/1989 | Ridley et al. |
| 4,866,525 A | 9/1989 | Rodriguez-Cavazos et al. |
| 4,931,716 A | 6/1990 | Jovanovic et al. |
| 4,961,048 A | 10/1990 | Banura |
| 5,063,488 A | 11/1991 | Harada et al. |
| 5,068,776 A | 11/1991 | Polivka |
| 5,122,728 A | 6/1992 | Ashley |
| 5,204,809 A | 4/1993 | Andresen |
| 5,262,930 A | 11/1993 | Hua et al. |
| 5,325,283 A | 6/1994 | Farrington et al. |
| 5,329,439 A | 7/1994 | Borojevic et al. |
| 5,373,432 A | 12/1994 | Vollin et al. |
| 5,418,702 A | 5/1995 | Marinus et al. |
| 5,418,704 A | 5/1995 | Hua et al. |
| 5,432,695 A | 7/1995 | Vlatkovic et al. |
| 5,442,540 A | 8/1995 | Hua et al. |
| 5,477,858 A | 12/1995 | Norris et al. |
| 5,479,087 A | 12/1995 | Wright |
| 5,486,752 A | 1/1996 | Hua et al. |
| 5,530,396 A | 6/1996 | Vlatkovic et al. |
| 5,541,828 A | 7/1996 | Rozman |
| 5,574,636 A | 11/1996 | Lee et al. |
| 5,633,793 A | 5/1997 | Lee et al. |
| 5,694,302 A | 12/1997 | Faulk |
| 5,793,272 A | 8/1998 | Burghartz et al. |
| 5,914,572 A | 6/1999 | Qian et al. |
| 5,920,471 A | 7/1999 | Rajagopalan et al. |
| 5,949,199 A | 9/1999 | Qian et al. |
| 5,982,160 A * | 11/1999 | Walters ................ H02M 3/156 323/222 |
| 6,018,468 A | 1/2000 | Archer et al. |
| 6,043,634 A | 3/2000 | Nguyen et al. |
| 6,057,652 A | 5/2000 | Chen et al. |
| 6,114,937 A | 9/2000 | Burghartz et al. |
| 6,147,882 A | 11/2000 | Huber et al. |
| 6,211,579 B1 | 4/2001 | Blair |
| 6,268,093 B1 | 7/2001 | Kenan et al. |
| 6,330,170 B1 | 12/2001 | Wang et al. |
| 6,337,801 B2 | 1/2002 | Li et al. |
| 6,344,956 B1 | 2/2002 | Morita |
| 6,349,044 B1 | 2/2002 | Canales-Abarca et al. |
| 6,362,986 B1 | 3/2002 | Schultz et al. |
| 6,414,469 B1 | 7/2002 | Zhou et al. |
| 6,426,666 B1 | 7/2002 | Li et al. |
| 6,437,999 B1 | 8/2002 | Wittenbreder |
| 6,442,033 B1 | 8/2002 | Liu et al. |
| 6,452,815 B1 | 9/2002 | Zhu et al. |
| 6,466,459 B1 | 10/2002 | Guerrera |
| 6,480,086 B1 | 11/2002 | Kluge et al. |
| 6,531,740 B2 | 3/2003 | Bosco et al. |
| 6,545,450 B1 | 4/2003 | Ledenev et al. |
| 6,552,565 B2 | 4/2003 | Chang et al. |
| 6,552,917 B1 | 4/2003 | Bourdillon |
| 6,569,481 B1 * | 5/2003 | Malfait ................ A23P 30/10 426/446 |
| 6,587,356 B2 | 7/2003 | Zhu et al. |
| 6,590,791 B1 | 7/2003 | Zhou et al. |
| 6,600,640 B1 | 7/2003 | Buscher et al. |
| 6,636,430 B1 | 10/2003 | Batarseh et al. |
| 6,650,217 B1 | 11/2003 | Wolf et al. |
| 6,683,797 B2 | 1/2004 | Zaitsu et al. |
| 6,696,803 B2 | 2/2004 | Tao et al. |
| 6,696,823 B2 | 2/2004 | Ledenev et al. |
| 6,710,639 B2 | 3/2004 | Huang et al. |
| 6,737,842 B2 | 5/2004 | Bai et al. |
| 6,757,184 B2 | 6/2004 | Wei et al. |
| 6,781,853 B2 | 8/2004 | Xu et al. |
| 6,784,644 B2 | 8/2004 | Xu et al. |
| 6,800,985 B2 | 10/2004 | Baker et al. |
| 6,815,937 B2 | 11/2004 | Poon et al. |
| 6,819,574 B2 | 11/2004 | Xu et al. |
| 6,834,002 B2 | 12/2004 | Yang |
| 6,859,372 B2 | 2/2005 | Xu et al. |
| 6,876,556 B2 | 4/2005 | Zhu et al. |
| 6,933,541 B1 | 8/2005 | Huang |
| 6,944,033 B1 | 9/2005 | Xu et al. |
| 6,952,335 B2 | 10/2005 | Huang et al. |
| 6,989,997 B2 | 1/2006 | Xu et al. |
| 7,016,203 B2 | 3/2006 | Xu et al. |
| 7,046,527 B2 | 5/2006 | West |
| 7,071,660 B2 | 7/2006 | Xu et al. |
| 7,106,035 B2 | 9/2006 | Xing |
| 7,109,838 B2 | 9/2006 | Brennan et al. |
| 7,132,820 B2 | 11/2006 | Walters et al. |
| 7,161,335 B2 | 1/2007 | Wei et al. |
| 7,180,389 B2 | 2/2007 | Wang et al. |
| 7,184,281 B2 | 2/2007 | Ren et al. |
| 7,196,914 B2 | 3/2007 | Ren et al. |
| 7,199,695 B1 | 4/2007 | Zhou et al. |
| 7,233,132 B1 * | 6/2007 | Dong ................ H02M 3/1584 323/272 |
| 7,254,047 B2 | 8/2007 | Ren et al. |
| 7,265,525 B2 | 9/2007 | Xu et al. |
| 7,304,867 B2 | 12/2007 | Usui |
| 7,317,305 B1 | 1/2008 | Stratakos et al. |
| 7,352,269 B2 | 4/2008 | Li et al. |
| 7,358,710 B2 | 4/2008 | Luo et al. |
| 7,391,165 B2 | 6/2008 | Lee et al. |
| 7,447,924 B2 | 11/2008 | May |
| 7,498,782 B2 | 3/2009 | Nguyen et al. |
| 7,498,920 B2 | 3/2009 | Sullivan et al. |
| 7,525,408 B1 | 4/2009 | Li et al. |
| 7,528,625 B2 | 5/2009 | Ozasa et al. |
| 7,531,407 B2 | 5/2009 | Clevenger et al. |
| 7,545,208 B2 | 6/2009 | Rodriguez |
| 7,548,137 B2 | 6/2009 | Wang et al. |
| 7,554,423 B2 | 6/2009 | Wang et al. |
| 7,560,833 B2 | 7/2009 | Strzalkowski et al. |
| 7,560,912 B2 | 7/2009 | Xu et al. |
| 7,569,875 B2 | 8/2009 | Suzuki et al. |
| 7,570,037 B2 | 8/2009 | Li et al. |
| 7,583,065 B2 | 9/2009 | Xu et al. |
| 7,602,154 B2 | 10/2009 | Fu et al. |
| 7,602,159 B2 | 10/2009 | Wang et al. |
| 7,605,572 B2 | 10/2009 | Xu et al. |
| 7,613,020 B2 | 11/2009 | Nukisato et al. |
| 7,638,988 B2 | 12/2009 | Lim et al. |
| 7,649,434 B2 | 1/2010 | Xu et al. |
| 7,705,577 B2 | 4/2010 | Li et al. |
| 7,742,318 B2 | 6/2010 | Fu et al. |
| 7,746,041 B2 | 6/2010 | Xu et al. |
| 7,746,209 B1 | 6/2010 | Li et al. |
| 7,746,675 B2 | 6/2010 | Wang et al. |
| 7,772,955 B1 | 8/2010 | Li et al. |
| 7,791,321 B2 | 9/2010 | Xu et al. |
| 7,800,922 B2 | 9/2010 | Takayanagi et al. |
| 7,804,281 B2 | 9/2010 | Wang et al. |
| 7,821,375 B2 | 10/2010 | Dong et al. |
| 7,859,238 B1 | 12/2010 | Stratakos et al. |
| 7,864,016 B1 | 1/2011 | Li et al. |
| 7,872,886 B2 | 1/2011 | Xu et al. |
| 7,876,191 B2 | 1/2011 | Chandrasekaran et al. |
| 7,893,669 B2 | 2/2011 | Osterhout et al. |
| 7,893,806 B1 | 2/2011 | Li et al. |
| 7,898,379 B1 | 3/2011 | Stratakos et al. |
| 7,932,800 B2 | 4/2011 | Lim et al. |
| 7,965,165 B2 | 6/2011 | Ikriannikov et al. |
| 7,977,763 B2 | 7/2011 | Lin et al. |
| 7,982,441 B2 | 7/2011 | Crowther et al. |
| 7,994,888 B2 | 8/2011 | Ikriannikov |
| 8,030,908 B2 | 10/2011 | Huang |
| 8,044,645 B2 | 10/2011 | Zambetti et al. |

(56) References Cited

U.S. PATENT DOCUMENTS

| | | | |
|---|---|---|---|
| 8,053,890 B2 | 11/2011 | Puma et al. | |
| 8,072,200 B1 | 12/2011 | Qiu et al. | |
| 8,208,878 B1 | 6/2012 | Hardy et al. | |
| 8,238,122 B2 | 8/2012 | Torrico-Bascope et al. | |
| 8,258,734 B2 | 9/2012 | Takeuchi | |
| 8,350,658 B1 | 1/2013 | Stratakos et al. | |
| 8,368,368 B2* | 2/2013 | Qiu | H02M 3/156 323/222 |
| 8,416,043 B2 | 4/2013 | Ikriannikov | |
| 8,576,000 B2 | 11/2013 | Kim et al. | |
| 8,592,966 B2 | 11/2013 | Wood et al. | |
| 8,829,879 B2* | 9/2014 | Latham, II | H02M 3/156 323/285 |
| 8,947,186 B2 | 2/2015 | Kurs et al. | |
| 8,957,514 B1 | 2/2015 | Barnette | |
| 8,981,753 B2* | 3/2015 | Giannopoulos | H02M 3/156 323/284 |
| 9,219,422 B1 | 12/2015 | Barnette | |
| 2002/0096697 A1 | 7/2002 | Tihanyi | |
| 2005/0225307 A1 | 10/2005 | Sato et al. | |
| 2006/0291260 A1 | 12/2006 | Nakashima | |
| 2007/0195563 A1 | 8/2007 | Shiraishi et al. | |
| 2007/0252659 A1 | 11/2007 | Suenaga et al. | |
| 2008/0067990 A1 | 3/2008 | Wei | |
| 2009/0086514 A1 | 4/2009 | Fornage et al. | |
| 2010/0127683 A1 | 5/2010 | Uno et al. | |
| 2011/0043173 A1 | 2/2011 | Blaumeiser et al. | |
| 2011/0090716 A1 | 4/2011 | Asuke et al. | |
| 2011/0133716 A1 | 6/2011 | Cheung et al. | |
| 2011/0248812 A1 | 10/2011 | Hu et al. | |
| 2011/0279100 A1 | 11/2011 | Ikriannikov | |
| 2011/0313749 A1 | 12/2011 | Wu | |
| 2012/0002446 A1 | 1/2012 | Madawala et al. | |
| 2013/0099887 A1 | 4/2013 | Yamamoto | |
| 2013/0141199 A1 | 6/2013 | Hayes et al. | |
| 2013/0141878 A1 | 6/2013 | Wu et al. | |
| 2013/0154590 A1 | 6/2013 | Ragona et al. | |
| 2013/0154595 A1 | 6/2013 | Drinovsky | |
| 2013/0221885 A1 | 8/2013 | Hunter | |
| 2013/0229830 A1 | 9/2013 | Barnette et al. | |
| 2013/0229831 A1 | 9/2013 | Barnette et al. | |
| 2014/0132234 A1 | 5/2014 | Barnette et al. | |
| 2014/0132237 A1 | 5/2014 | Barnette et al. | |
| 2014/0145688 A1 | 5/2014 | Ikriannikov | |
| 2015/0097615 A1 | 4/2015 | Barnette | |
| 2016/0111960 A1 | 4/2016 | Barnette et al. | |

FOREIGN PATENT DOCUMENTS

| | | |
|---|---|---|
| JP | 05-022935 | 1/1993 |
| JP | 02012-060854 A | 3/2012 |
| TW | 271917 B1 | 1/2007 |
| WO | WO 2010/002906 A2 | 1/2010 |

OTHER PUBLICATIONS

Sullivan, C. R., "Computationally Efficient Winding Loss Calculation with Multiple Windings, Arbitrary Waveforms and Two- or Three-Dimensional Field Geometry", IEEE Transactions on Power Electronics, Jan. 2001, pp. 142-150, vol. 16, No. 1, IEEE, USA, Digital Object Identifier: 10.1109/63.903999.

Kelly, S. et al., "Core Materials for High Frequency VRM Inductors", Power Electronics Specialists Conference, Jun. 17-21, 2007, pp. 1767-72, IEEE, USA, Digital Object Identifier: 10.1109/PESC. 2007.4342267.

Prabhakaran. S., et al., "Fabrication of Thin-Film V-Groove Inductors Using Composite Magnetic Materials", International Workshop on Integrated Power Packaging, Jul. 2000, pp. 102-105, Digital Object Identifier: 10.1109/IWIPP.2000.885191, IEEE, USA.

Ghahary, A., "Fully Integrated DC-DC Converters", Power Electronics Technology, Aug. 2004, pp. 24-27, Penton Business Media Inc., Overland Park, KS, USA.

Park, J., et al., "Fully Integrated Micromachined Inductors With Electroplated Anisotropic Magnetic Cores", Thirteenth Annual Applied Power Electronics Conference and Exposition, Feb. 15-19, 1998, pp. 379-385 vol. 1, Digital Object Identifier: 10.1109/APEC. 1998.647718, IEEE, USA.

Yao, K., et al., "Design Considerations for VRM Transient Response Based on the Output Impedance", IEEE Transactions on Power Electronics, Nov. 2003, pp. 1270-1277, vol. 18, No. 6, Digital Object Identifier: 10.1109/TPEL.2003.818824, IEEE, USA.

Parker, S., "Characterizing Properties of Magnetic Films Deposited on Silicon Wafers", May 2009, pp. 39-42, Tuscaloosa, AL, USA.

"Physics Lecture 17—Magnetic Fields cont'd.", upenn.edu (online), accessed Sep. 7, 2011, 5 pages, URL: http://www.physics.upenn.edu/courses/gladney/phys151/lectures/lecture_mar_07_2003.shtml#tth_sEc8.3.

Wang, N., et al., "Micro-fabricated inductors on silicon for DC-DC converters operating at tens MHz", powersoc.org (online), accessed Feb. 10, 2012, 1 page, URL:http://www.powersoc.org/PwrSOC08/Presentations/Received/Poster%20P12%20-%20Ningning %20Wang%20et%20al.%20-%20Micro-fabricated%20inductors %20on%20silicon%20for%20DC-DC%20converters%20operating %20at%20tens%20of%20MHz.pdf.

O'Donnell, T., et al., "Microfabricated Inductors for 20 MHz Dc-Dc Converters", Twenty-Third Annual IEEE Applied Power Electronics Conference and Exposition, Feb. 24-28, 2008, pp. 689-693, Digital Object Identifier: 10.1109/APEC.2008.4522796, IEEE, USA.

Phillips, M.D. et al., "A Novel Toroidal Inductor Structure With Through-Hole Vias in Ground Plane", IEEE Transactions on Microwave Theory and Techniques, Jun. 2006, pp. 1325-1330, vol. 54, No. 4, Digital Object Identifier: 10.1109/TMTT.2006.871352, IEEE, USA.

Raieszadeh, M.,"High-Q Integrated Inductors on Trenched Silicon Islands", Thesis, Apr. 12, 2005, pp. 1-92, Georgia Institute of Technology, USA.

Kelly, S., et al., "Core Materials for High Frequency VRM Inductors", IEEE Power Electronics Specialists Conference, Jun. 17-21, 2007, pp. 1767-1772, Digital Object Identifier: 10.1109/PESC. 2007.4342267, IEEE, Orlando, FL, USA.

Rincon-Mora, G.A., et al., "How to fully integrate switching DC-DC supplies with inductor multipliers", EE Times Design, Dec. 18, 2005, pp. 1-3, UBM Electronics, San Francisco, CA, USA.

"Toroidal Magnetic Field," hyperphysics.phy-astr.gsu.edu (online), accessed Sep. 7, 2011, 3 pages, URL: http://hyperphysics.phy-astr.gsu.edu/hbase/magnetic/toroid.html.

Steiner, et al., "A Tuning Transformer for the Automatic Adjustment of Resonant Loop Antennas in RFID Systems", 2004 IEEE International Conference on Industrial Technology (IEEE ICIT '04), Dec. 2004, pp. 912-916, IEEE, Digital Object Identifier: 10.1109/ICIT.2004.1490196.

Wegleiter, et al., "Automatic Antenna Tuning Unit to Improve RFID System Performance", IEEE Transactions on Instrumentation and Measurement, May 2011, pp. 2797-2803 (section III), vol. 60, Issue 8, IEEE, Digital Object Identifier: 10.1109/TIM.2011.2122390.

Taheri, M., et al., "Analysis and Design of a New Soft Switching Interleaved Converter Using an Integrated Transformer", 2011 $2^{nd}$ Power Electronics, Drive Systems and Technologies Conference (PEDSTC), Feb. 16-17, 2011, pp. 98-103, IEEE, New York, Digital Object Identifier: 10.1109/PEDSTC.2011.5742505.

Xuechao, L., et al., "A Non-isolated Voltage Regulator Module With Integrating Coupled-Inductor", from IEEE $36^{th}$ Power Electronics Specialists Conference 2005 (PESC '05), Jun. 16, 2005, pp. 438-442, IEEE, New York, Digital Object Identifier: 10.1109/PESC. 2005.1581661.

Cho, et al., "A Novel Transformer Winding for Phase Shift Full Bridge Converter", 31st International Telecommunications Energy Conference 2009 (INTELEC 2009), Oct. 18-22, 2009, pp. 1-5, IEEE, New York, Digital Object Identifier: 10.1109/INTLEC.2009. 5351785.

Do, H.L., "Interleaved Boost Converter With a Single Magnetic Component", IET Power Electronics, Aug. 2011, pp. 842-849, vol. 4, Issue. 7, IEEE, United Kingdom, Digital Object Identifier: 10.1049/iet-pel.2010.0256.

(56) References Cited

OTHER PUBLICATIONS

Qian, T., et al., "Coupled Input-Series and Output-Parallel Dual Interleaved Flyback Converter for High Input Voltage Application", IEEE Transactions on Power Electronics, Jan. 2008, pp. 88-95, vol. 23, Issue. 1, IEEE, New York, Digital Object Identifier: 10.1109/TPEL.2007.911867.
University of Colorado, Boulder, "The Flyback Converter", Lecture Notes ECEN 4517: Power Electronics and Photovoltaic Power Systems Laboratory, Department of Electrical and Computer Engineering, Spring 2011, pp. 1-11, University of Colorado, Boulder, CO.
Dixon, "Inductor and Flyback Transformer Design", 2001 Magnetics Design Handbook—MAG100A, Mar. 15, 2001, pp. 5-1 to 5-19, Section 5, Texas Instruments Incorporated, Dallas, Texas, USA.
Dixon Jr, L., "The Effects of Leakage Inductance on Switching Power Supply Performance", 2001 Magnetics Design Handbook—MAG100A, Mar. 15, 2001, pp. R4 to R7, Texas Instruments Incorporated, Dallas, TX, USA.
Zhou et al.; "Exploration of On-Chip Switched-Capacitor DC-DC Converter for Multicore Processors Using a Distributed Power Delivery Network", Custom Integrated Circuits Conference (CICC), Sep. 2011, pp. 1-4, IEEE.org (online), doi: 10.1109/CICC.2011.6055333, URL: http://ieeexplore.ieee.org/stamp/stamp.jsp?tp=&arnumber=6055333&isnumber=6055276.
Kudva et al.; "Fully-Integrated On-Chip DC-DC Converter With a 450X Output Range", 2010 IEEE Custom Integrated Circuits Conference (CICC), Sep. 2010, pp. 1-4, IEEE.org (online), doi: 10.1109/CICC.2010.5617588, URL: http://ieeexplore.ieee.org/stamp/stamp.jsp?tp=&arnumber=5617588&isnumber=5617377.
Garner et al., "The Integration of High-Side and Low-Side LIGBTS on Partial Silicon-On-Insulator", Solid-State Electronics, vol. 44, Issue 6, Jun. 2000, pp. 929-935, sciencedirect.com (online), doi: 10.1016/S0038-1101(00)00018-6, URL: http://dx.doi.org/10.1016/S0038-1101(00)00018-6.
Goldman, M., et al., "Analysis and Prediction of Regulation in a Multiple-Output Current-Mode Controlled DC-to-DC Converter", IEEE Transactions on Aerospace and Electronic Systems, vol. 31, Issue: 2, Apr. 1995, pp. 626-633, Institute of Electrical and Electronics Engineers (IEEE), USA, Digital Object Identifier: 10.1109/7.381911.
Schrom et al., "Feasibility of Monolithic and 3D-Stacked DC-DC Converters for Microprocessors in 90nm Technology Generation", In Proceedings of the 2004 international ACM Symposium on Low Power Electronics and Design (ISLPED'04), Aug. 2004, ACM New York, NY, USA.
Sturcken et al., "Design of Coupled Power Inductors with Crossed Anisotropy Magnetic Core for Integrated Power Conversion", Twenty-Seventh Annual IEEE Applied Power Electronics Conference and Exposition (APEC), Feb. 2012, pp. 417-423, IEEE Xplore Digital Library (online publication), DOI: 10.1109/APEC.2012.6165853.
Wong, "Performance Improvements of Multi-Channel Interleaving Voltage Regulator Modules with Integrated Coupling Inductors", PhD Thesis, Mar. 28, 2001, 224 pages, Virginia Polytechnic Institute and State University, Blacksburg, Virginia.
Pandya et al., "A Simplified Method of Generating Thermal Models for Power MOSFETs", Eighteenth Annual IEEE Symposium on Semiconductor Thermal Measurement and Management, Mar. 2002, pp. 83-87, IEEE Xplore Digital Library (online publication), DOI: 10.1109/STHERM.2002.991350.
Wong et al., "A Novel Modeling Concept for Multi-coupling Core Structures", Sixteenth Annual IEEE Applied Power Electronics Conference and Exposition (APEC), Mar. 2001, pp. 102-108, vol. 1, IEEE Xplore Digital Library (online publication), DOI: 10.1109/APEC.2001.911634.
Ille et al., "Reliability Aspects of Gate Oxide under ESD Pulse Stress", 29th Electrical Overstress/Electrostatic Discharge Symposium (EOS/ESD), Sep. 2007, pp. 6A.1-1-6A.1-10, IEEE Xplore Digital Library (online publication), DOI: 10.1109/EOSESD.2007.4401771.
Pulse, "SMT Power Inductors Power Beads—PA0766NL Series", Data Sheet, Jul. 2009, 3 pages, pulseeng.com (online publication), URL: http://media.digikey.com/pdf/Data%20Sheets/Pulse%20PDFs/PA0766NL_Series.pdf.
Oraw et al., "Lossless DCR Current Sensing for Multi-Winding Coupled Inductors", IEEE 30th International Telecommunications Energy Conference (INTELEC 2008), Sep. 2008, 6 pages, IEEE Xplore Digital Library (online) (ieeexplore.ieee.org), DOI: 10.1109/INTLEC.2008.4664023.
Xiao et al., "Parasitic resistance current sensing topology for coupled inductors", International Journal of Electronics, vol. 96, No. 1, Jan. 2009, pp. 51-61, Taylor & Francis (online) (informaworld.com), DOI: 10.1080/00207210802492336.
Ikriannikov et al., "Investigation of DCR Current Sensing in Multiphase Voltage Regulators", Volterra Semiconductor: IBM Power and Cooling Technology Symposium, Oct. 2007, 17 pages, IBM Corporation, USA.
Xu et al., "Novel Coupled-Inductor Multi-phase VRs", Twenty Second Annual IEEE Applied Power Electronics Conference (APEC 2007), Feb. 25-Mar. 1, 2007, pp. 113-119, IEEE Xplore Digital Library (online) (ieeexplore.ieee.org), DOI: 10.1109/APEX.2007.357503.
Dong et al., "DCR Current Sensing Method for Achieving Adaptive Voltage Positioning (AVP) in Voltage Regulators with Coupled Inductors", 37th IEEE Power Electronics Specialists Conference (PESC '06), Jun. 2006, 7 pages, IEEE Xplore Digital Library (online) (ieeexplore.ieee.org), DOI: 10.1109/PESC.2006.1712003.
U.S. Appl. No. 14/465,064, Aug. 21, 2014, pp. 1-39.
Dong et al., "DCR Current Sensing Method for Achieving Adaptive Voltage Positioning(AVP) in Voltage Regulators with Coupled Inductors", 37th IEEE Power Electronics Specialists Conference (PESC '06), Jun. 2006, 7 pages, IEEE Xplore Digital Library (online) (ieeexplore.ieee.org), DOI: 10.1109/PESC.2006.1712003.
U.S. Appl. No. 14/465,064, filed Aug. 21, 2014, pp. 1-39.

\* cited by examiner

*Prior Art*

Prior Art DC-DC Converter
100

Prior Art DC-DC Converter
Timing Diagram 130

Identity Switching DC-DC Converter 200

Identity Switching DC-DC Converter Timing Diagram 230

Identity Switching DC-DC Converter 300

*Prior Art*

Prior Art DC-DC Converter
With Current Sensing 500

Identity Switching DC-DC
Converter With Current Sensing
600

Identity Switching DC-DC
Converter With Current
Sensing 700

SENSING CURRENT OF A DC-DC CONVERTER

BACKGROUND OF THE INVENTION

Field of the Invention

The field of the invention is power conversion, or, more specifically, methods and apparatus for sensing current of a DC ('Direct Current')-DC converter.

Description of Related Art

Computer system technology is continually advancing. Data centers, for example, now include hundreds or thousands of servers. Given the number of servers in a data center, decreasing the physical size or 'footprint' of the servers is a top priority for server system and server component designers. One are of focus, for example, is in reducing the size of Direct Current ('DC')-DC converters that distribute DC power amongst components of servers and the like.

In current art, reducing the size of such DC-DC converters is limited, at least in part, by the need for a plurality output inductors and a filter capacitor. Some DC-DC converters of the prior art have implemented designs to somewhat reduce the physical footprint of the inductors and the capacitor by utilizing a single magnetic core for multiple inductors, or a multiple magnetic core coupled to behave as one single unit—an implementation of an indirectly coupled inductor. FIG. 1A, for example, sets forth a prior art DC-DC converter that includes an indirectly coupled inductor.

The example DC-DC converter (100) of FIG. 1A includes two power-switching phases (132, 134). Each phase includes two switches: a high-side switch (102, 106), and a low-side switch (104, 108). Each high-side switch (102, 106) includes a control input (110, 114) to activate the switch. Upon activation, each high-side switch (102, 106) couples a voltage source ($V_{IN}$) to an indirectly coupled inductor (118). Each low-side switch (104, 108) also includes a control input (112, 116) to activate the switch. Upon activation, each low-side switch (104, 108) couples one coil of indirectly coupled inductor (118) to a ground voltage.

Coupled inductors come in two forms: indirectly coupled and directly coupled. The dots depicted in the example of FIG. 1A indicate the coupled inductor (118) is an indirectly coupled inductor. The dot convention specifies the flow of current in a coupled inductor as: when current flows 'into' one dot, current is induced in the alternate coil of the coupled inductor and flows 'out of' the other dot. Thus, in an indirectly coupled inductor, current generally flows in the same direction in both coils of the coupled inductor.

The example prior art DC-DC converter (100) of FIG. 1A also includes an output capacitor (120) that operates as a lowpass filter and a load, represented by a resistor (122).

FIG. 1B sets forth an example timing diagram (130) of activating the switches (102, 112, 106, 116) of the prior art DC-DC converter (100) of FIG. 1A. In the example timing diagram of FIG. 1B, switch (102) is activated between time $T_0$ and $T_1$, then deactivated from $T_1$ through $T_3$. Switch (112) is not activated from time $T_0$ and $T_1$, but is activated at time $T_1$ through $T_3$. Switch (114) is only activated between time $T_2$ to $T_3$. Switch (116) is activated from time $T_0$ to $T_2$ and activated again at time $T_3$.

The timing diagram (130) in the example of FIG. 1B specifies that activation of the high-side switch and low-side switch in a single phase of the prior art DC-DC converter (100) of FIG. 1 is asynchronous. Further, during any one given time period, two of the switches are activated at the same time. Although the indirectly coupled inductor in the example prior art DC-DC converter (100) of FIG. 1A represents a reduction in size relative to two, discrete inductors, operating the indirectly coupled prior art DC-DC converter (100) in accordance with the timing diagram of FIG. 1B limits any further inductor and capacitance reduction due to many factors, including for example: efficiency, current ripple, and so on. Other similar circuits of the prior art also has several limitations including:

Prior art circuits rely on an equal DC current to flow through windings of the inductor to gain flux canceling affects, which requires highly accurate current sensing;

Because current flow through all legs of the inductor of the prior art occurs simultaneously no accurate current sensing can take place with industry standard DCR (DC resistance) sensing;

Prior art circuits with indirectly coupled inductors employ loops to form the indirectly coupled inductors which creates additional series resistance that inversely affects regulator efficiently;

In prior art circuits, the leakage inductance sets the current ripple of the design, so there is a minimum leakage inductance that must exist, bounding transient performance of the design, and requiring a higher switching frequency; and Adding additional phases in parallel in prior art circuits inversely affects the transient performance of design, where the slew rate the load can be supplied is bounded the voltage input, number of phases, and leakage inductance.

In systems that rely on such DC-DC converters of the prior art, sensing the output current of the DC-DC converter may be useful. Prior art current sensing techniques, however, are costly in terms of power consumption, space consumption, and are generally overly complex. Consider, for example, FIG. 5 which sets forth a prior art DC-DC converter with current sensing (500). The DC-DC converter of FIG. 5 is similar to that set forth in FIG. 1A. The only appreciable difference between the two DC-DC converters is that, in FIG. 5, each phase of the DC-DC converter includes a DCR current sensing circuit. That is, in the example of FIG. 5, each phase (132, 134) includes, in parallel to the indirectly coupled inductor (118), a DCR (direct current resistance) circuit. Each DCR circuit includes an RC network (506, 508). Each DCR circuit also includes a current amplifier (502m 504). The output (510, 512) of each current amplifier may be measured and provide an indication of output current of the phase to which the current amplifier is coupled.

Capacitors are larger than many other components and current amplifiers drain power in greater amounts than other components. Because each additional phase of the DC-DC converter of the prior art requires an additional DCR circuit (including an additional current amplifier and an additional capacitor) to sense the current of that additional phase, each additional phase increases power and space consumption.

SUMMARY OF THE INVENTION

Methods for current sensing in a DC-DC converter and current sensors for such DC-DC converters are described in this specification. Such a DC-DC converter includes: a directly coupled inductor comprising a plurality of coil elements; and a plurality of power-switching phases, each power-switching phase coupled to a different one of the plurality of coil elements, each phase including: a high-side switch and a low-side switch, where the high-side switch is configured, when activated, to couple a voltage source to one of the coil elements and the low-side switch is configured, when activated, to couple the coil element to a ground voltage, where each switch of the DC-DC converter is configured to be alternately activated and no two switches are activated at the same time.

Current sensing in such a DC-DC converter in accordance with embodiments of the present invention may be carried out by measuring a current sensing signal provided by a current sensor. Such a current sensor includes: a single current amplifier that includes a plurality of inputs and an output, where the output provides a current sensing signal. The current sensor also includes a single RC network ('Resistor-Capacitor network') coupled to one of the power-switching phases and a first input of the current amplifier, where the RC network includes a resistor in series with a capacitor. The current sensor also includes a resistive ladder that includes: for each of the other power-switching phases, a resistor coupled in parallel to the resistor of the RC network and coupled to a second input of the current amplifier.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 2A:
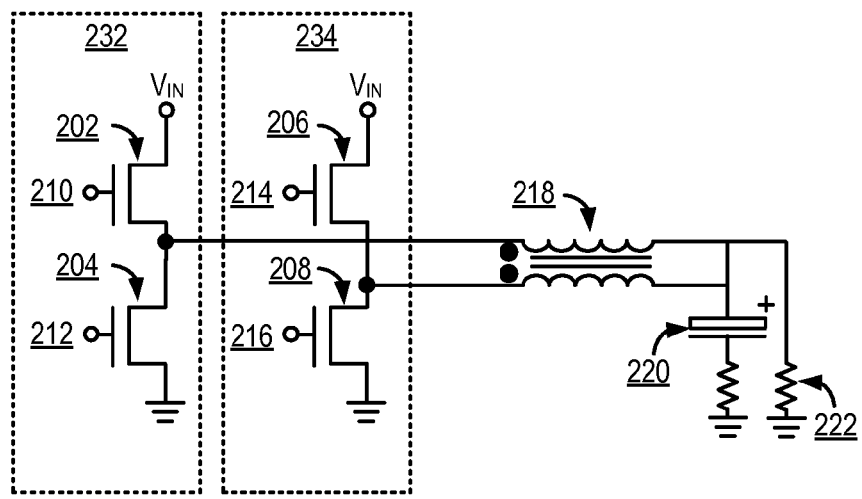
FIG. 2A sets forth sets forth an identity switching DC-DC converter that includes a directly coupled inductor, operated in accordance with embodiments of the present invention.

Exemplary methods and apparatus for operating a DC-DC converter in accordance with embodiments of the present invention are described with reference to the accompanying drawings, beginning with FIG. 2A. FIG. 2A sets forth sets forth an identity switching DC-DC converter that includes a directly coupled inductor, operated in accordance with embodiments of the present invention.

Figure 1A:
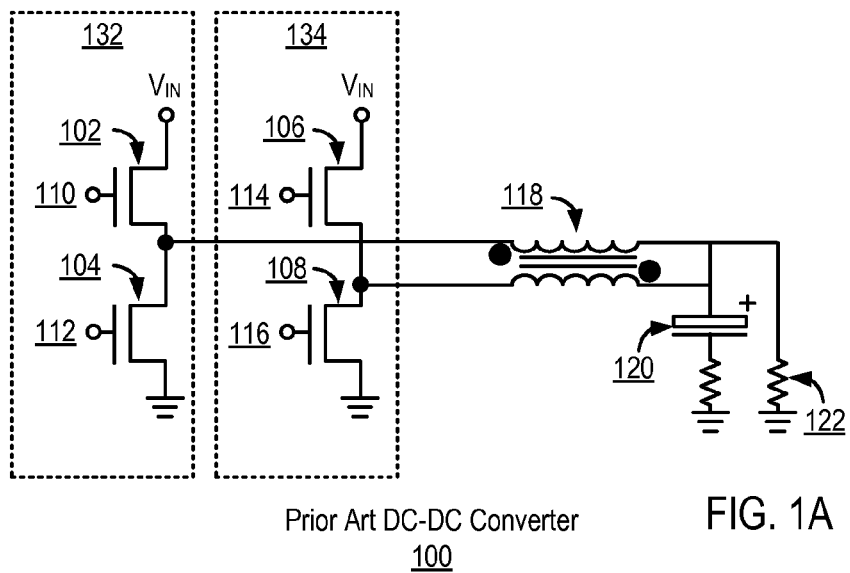
FIG. 1A sets forth a prior art DC-DC converter that includes an indirectly coupled inductor.
Figure 1B:
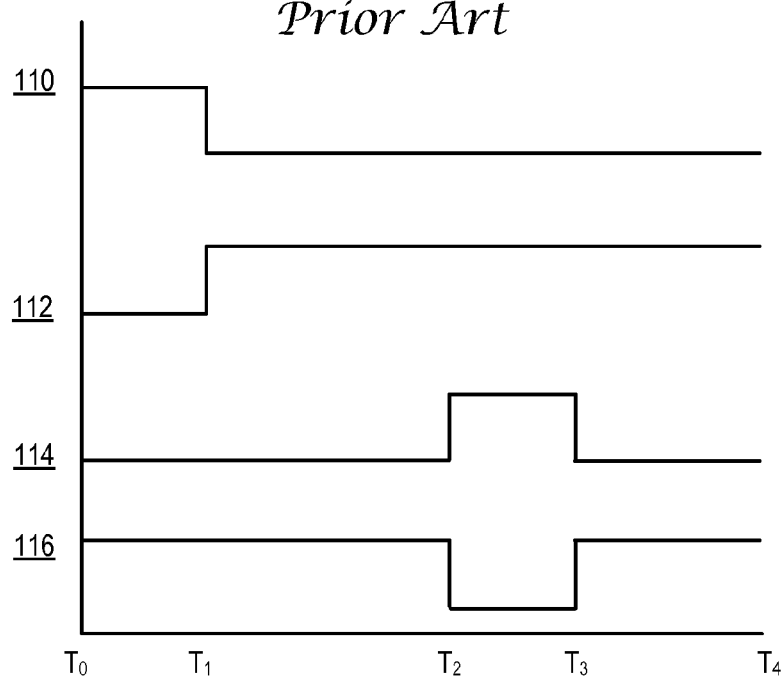
FIG. 1B sets forth an example timing diagram of activating switches of the prior art DC-DC converter of FIG. 1A.

The example identity switching DC-DC converter (200) of FIG. 2A includes a directly coupled inductor (218) that includes a first coil element and a second coil element. The first coil element and second coil element are coupled to an output filter—the capacitor (220)—and a load represented by a resistor (222). Unlike the prior art indirectly coupled inductor (118) of FIG. 1A, in the directly coupled inductor (218) in the example of FIG. 2A, current generally flows equal in magnitude and in the opposite direction in the coils of the coupled inductor. That is, when current enters one dot, current is induced to exit the other dot.

The example identity switching DC-DC converter (200) of FIG. 2A also includes a plurality of power-switching phases. More specifically, the example identity switching DC-DC converter (200) of FIG. 2A includes two power-switching phases (232, 234). Each power-switching phase is configured similarly: a first power-switching phase (232) includes a high-side switch (202) and a low-side switch (204). The high-side switch (202) is configured, when activated 180 degrees out of phase, by a control input (210), to couple a voltage source ($V_{IN}$) to the first coil element of the directly coupled inductor (218). The low-side switch (204) is configured, when activated by a control input (212), to couple the first coil element to a ground voltage.

The second power-switching phase (234) of the example identity switching DC-DC converter (200) of FIG. 2A includes a high-side switch (206) and a low-side switch (208). The high-side switch (206) of the second power-switching phase (234) is configured, when activated by a control input (214), to couple the voltage source ($V_{IN}$) to the second coil element of the directly coupled inductor (218). The low-side switch (208) of the second power-switching phase (234) is configured, when activated by a control input (216), to couple the second coil element to the ground voltage.

As will occur to readers of skill in the art, each of the switches (202, 204, 206, 208) in the example of FIG. 2A may be implemented as a Field Effect Transistor ('FET') or the like.

The identity switching DC-DC converter (200) of FIG. 2A is operated by alternatively activating each switch, where no two switches are activated at the same time. For further explanation, FIG. 2B sets forth an example timing diagram of activating switches of the identity switching DC-DC converter of FIG. 2A.

The DC-DC converter of FIG. 2A is described as an 'identity switching' converter due to the pattern of activating switches when viewed in a matrix or table. The example table below describes the timing of the switch activations as seen in the example timing diagram of FIG. 2B:

TABLE 1

Switch Activation Pattern For Identity
Switching DC-DC Converter (200) of FIG. 2A

| Control Input, Switch | $T_0$-$T_1$ | $T_1$-$T_2$ | $T_2$-$T_3$ | $T_3$-$T_4$ |
|---|---|---|---|---|
| CI (210), HS Switch (202) | 1 | 0 | 0 | 0 |
| CI (212), LS Switch (204) | 0 | 1 | 0 | 0 |
| CI (214), HS Switch (206) | 0 | 0 | 1 | 0 |
| CI (216), LS Switch (208) | 0 | 0 | 0 | 1 |

In the example Table 1 above, it can be seen that the control input and associated switches are alternatively activated (represented by a '1' in the table) in a manner that forms an identity of the table. Further, no two switches are activated at the same time. As depicted in Table 1 and the example timing diagram (230) of FIG. 2B:

from time $T_0$-$T_1$, only the high-side switch (202) of the first power-switching phase (232) is activated; from time $T_1$-$T_2$, only the low-side switch (204) of the first power-switching phase (232) is activated; from time $T_2$-$T_3$, only the high-side switch (206) of the second power-switching phase (234) is activated; and from time $T_3$-$T_4$, only the low-side switch (208) of the second power-switching phase (234) is activated.

A '0' in the table above represents that the switch is tri-stated, 0V, kept in the off position. That is, in embodiments in which the switches are implemented as FETs, no gate drive is applied to the silicon gate. In this way, when not activated, each switch may introduce a high impedance path to the system. As such, each loop coil element is alternatively coupled to the voltage source, the ground voltage, and the high impedance path.

Readers of skill in the art will recognize that the phrase "no two switches are activated at the same time" may be read literally in ideal conditions where the switches are implemented as unidirectional switches with little to no switching response time. In other, less ideal conditions, however—such as implementations in which the switches are implemented as FETs having a body diode—the phrase "no two switches are activated at the same time" means that no two switches are activated at nearly or approximately the same time. That is, the phrase "no two switches are activated at the same time" does not exclude minor overlap, but instead describes switch activation over a much longer time period—the switching period or duty cycle of the switches as a while. Two switches, for example, such as the low-side switch of the first phase and the high-side switch of the second phase may be activated at the same time, but for only for a very short amount of time, in order to fully discharge the body diode of the low-side switch. In such an example, immediately before the low-side switch of the first phase is deactivated, the high-side switch of the second phase may be activated in order to drain current in the body diode. The two switches in this implementation are 'on' concurrently for a very minimal amount of time, not representing an appreciable portion of the switching period of the switches. The phrase, "no two switches are activated at the same time," then, may be thought of relative to switching schemes of the prior art in which two switches are activated concurrently for a very long time during the a switching period or for an entire duty cycle.

In this way, each phase is utilized at a 180 degree offset and each high-side switch for a period of time according to:

$$\frac{D}{N},$$

where D represents a duty cycle and N represents the number of power-switching phases. Each low-side switch is therefore activated for a period of time according to:

$$\frac{(1-D)}{N}.$$

In this way, the number of phases is inversely proportional to the duty cycle of activating the switches—that is, the 'effective' duty cycle—and thereby is inversely proportional to the inductance of the directly coupled inductor. Increasing the number of phases, therefore, decreases the inductance.

Figure 2B:
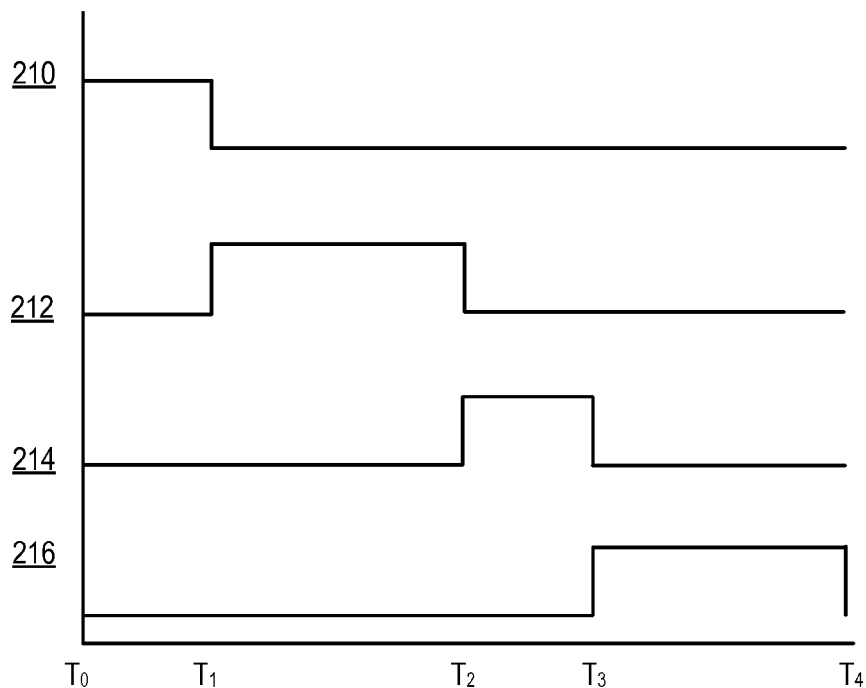
FIG. 2B sets forth an example timing diagram of activating switches of the identity switching DC-DC converter of FIG. 2A.

And the transfer function of the identity switching DC-DC converter (200) of FIG. 2A, when operated in accordance with the identity switching scheme in Table 1 and the timing diagram (230) of FIG. 2B is:

$$\frac{V_{OUT}}{V_{IN}} = \frac{D}{N}$$

Operating the example identity switching DC-DC converter (200) of FIG. 2A in accordance with the identity switching scheme in Table 1 and the timing diagram of FIG. 2B enables energy to be stored between deactivating the low-side switch (212) of the first power-switching phase (232) and activation of the high-side switch of the second power-switching phase (234), thus increasing overall system efficiency and reducing current ripple. That is, current ripple experienced by the magnetic core of the directly coupled inductor (218) and the output capacitor (220) is reduced, relative to circuits of the prior art, due in part to the effective reduced duty cycle of the switch activations. The current ripple experienced by the output filter capacitor (220) and the load (222) may be calculated as:

$$\frac{1}{f*L_{OL}} * \left(1 - \frac{V_{OUT}}{V_{IN}}\right) * \frac{V_{OUT}}{N},$$

where f represents the frequency of alternatively activating each switch, $L_{OL}$ represents the open loop inductance of the directly coupled inductor, N represents the number of power-switching phases, $V_{IN}$ represents the voltage of the voltage source and $V_{OUT}$ represents the voltage experienced at the output filter and load.

Figure 3:
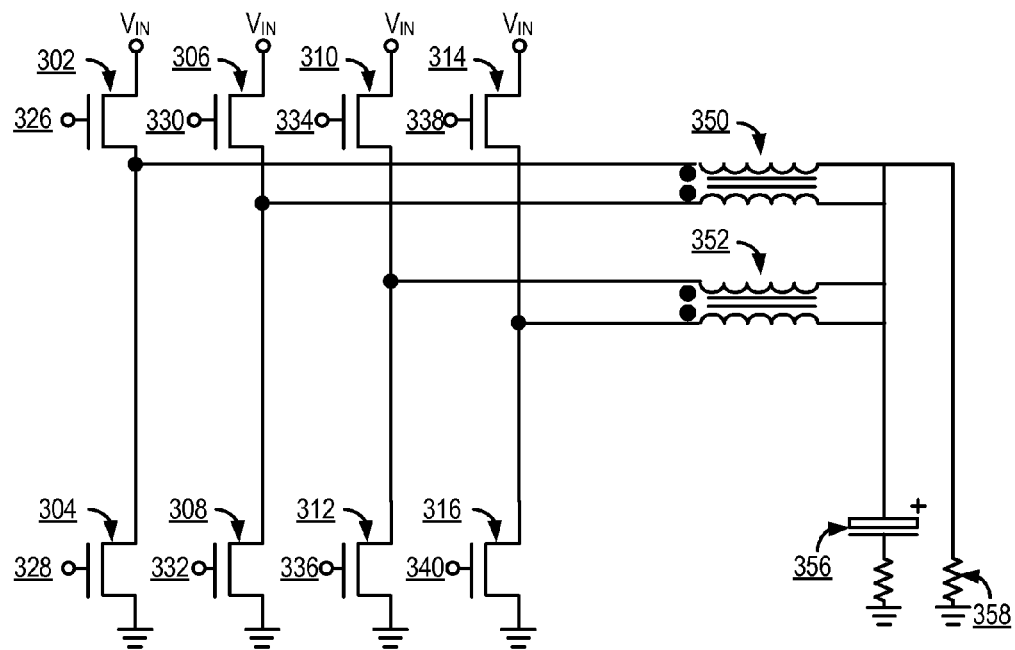
FIG. 3 depicts an identity switching DC-DC converter operated in accordance with embodiments of the present invention that includes a plurality of power-switching phases.

FIGS. 2A and 2B generally depict an identity switching DC-DC converter configured with two phases and operation thereof, but readers of skill in the art will recognize that an identity switching DC-DC converter operated in accordance with embodiments of the present invention may have any number of phases. For further explanation, therefore, FIG. 3 depicts an identity switching DC-DC converter (300) operated in accordance with embodiments of the present invention that includes a plurality of power-switching phases. The example DC-DC converter (300) of FIG. 3 includes four power-switching phases:

a first power-switching phase that includes a high-side switch (302) and a low-side switch (304);
a second power-switching phase that includes a high-side switch (306) and a low-side switch (308);
a third power-switching phase that includes a high-side switch (310) and a low-side switch (312); and
a fourth power-switching phase that includes a high-side switch (314) and a low-side switch (316).

Each high-side switch (302, 306, 310, 314) includes a control input (326, 330, 334, 338) for activating the switch. Each low-side switch (304, 308, 312, 316) includes a control input (328, 332, 336, 340) for activating the switch. Each pair of phases is connected to a directly coupled inductor (350, 352), an output filter capacitor (356), and a load (358).

The switches in the example identity switching DC-DC converter (300) of FIG. 3 are alternatively activated and no two switches are activated concurrently. The following table sets forth the timing of switch activations in the example DC_DC converter (300) of FIG. 3:

TABLE 2

Switch Activation Pattern For Identity Switching DC-DC Converter (300) of FIG. 3

| Control Input, Switch | 0 Deg. | 0 Deg. | 180 Deg | 180 Deg. | 90 Deg. | 90 Deg. | 270 Deg. | 270 Deg. |
|---|---|---|---|---|---|---|---|---|
| CI (326), HS Switch (302) | 1 | 0 | 0 | 0 | 0 | 0 | 0 | 0 |
| CI (328), LS Switch (304) | 0 | 1 | 0 | 0 | 0 | 0 | 0 | 0 |
| CI (330), HS Switch (306) | 0 | 0 | 1 | 0 | 0 | 0 | 0 | 0 |
| CI (332), LS Switch (308) | 0 | 0 | 0 | 1 | 0 | 0 | 0 | 0 |
| CI (334), HS Switch (310) | 0 | 0 | 0 | 0 | 1 | 0 | 0 | 0 |
| CI (336), LS Switch (312) | 0 | 0 | 0 | 0 | 0 | 1 | 0 | 0 |
| CI (338), HS Switch (314) | 0 | 0 | 0 | 0 | 0 | 0 | 1 | 0 |
| CI (340), LS Switch (316) | 0 | 0 | 0 | 0 | 0 | 0 | 0 | 1 |

In the example Table 2 above, no two switches are activated concurrently. The second power-switching phase operates an offset of 180 degrees from the first power-switching phase. The fourth power-switching phase operates at an offset of 180 degrees from the third power-switching phase.

Figure 4:
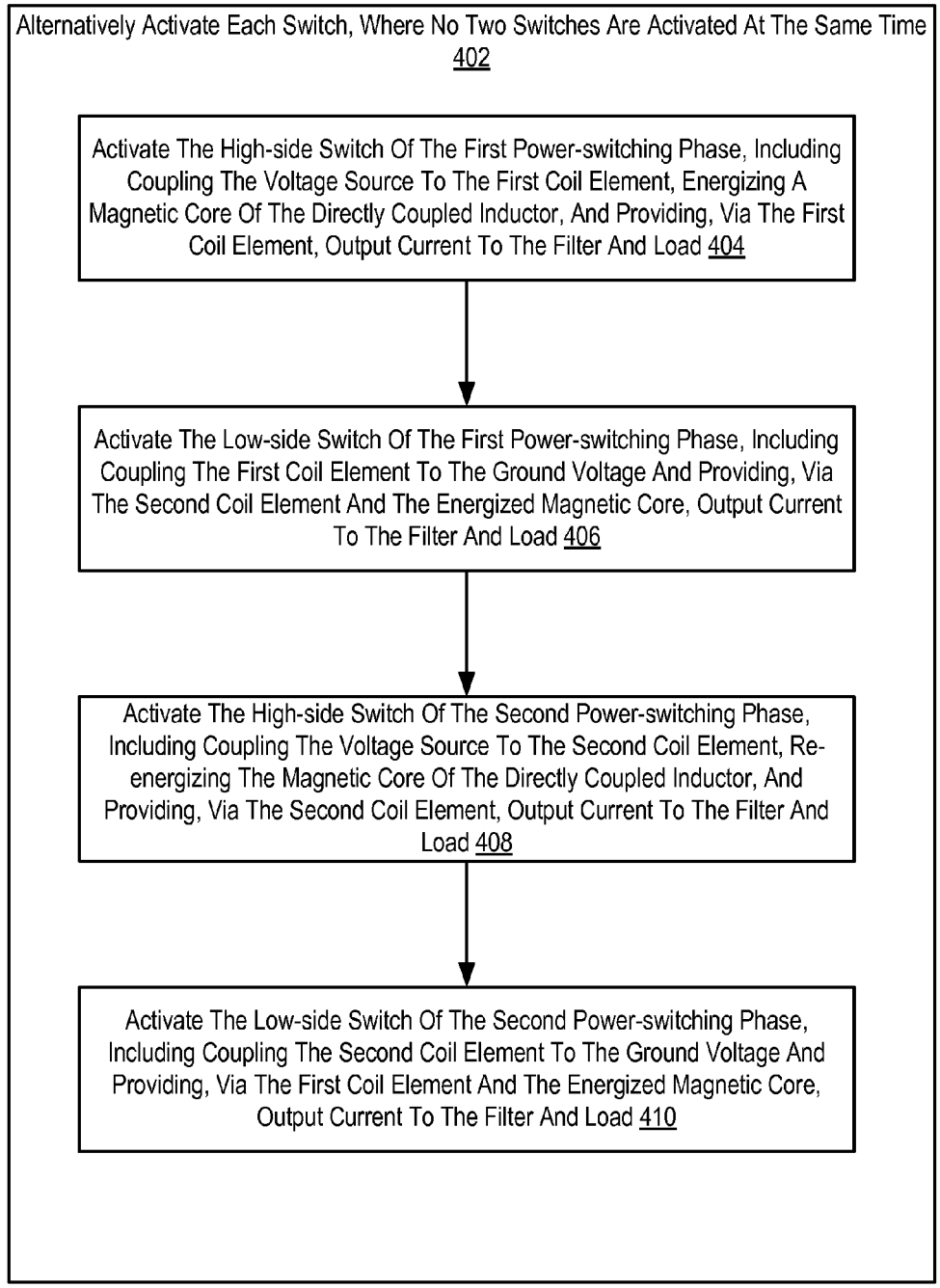
FIG. 4 sets forth a flow chart illustrating an example method of operation a DC-DC converter in accordance with embodiments of the present invention.
Figure 5:
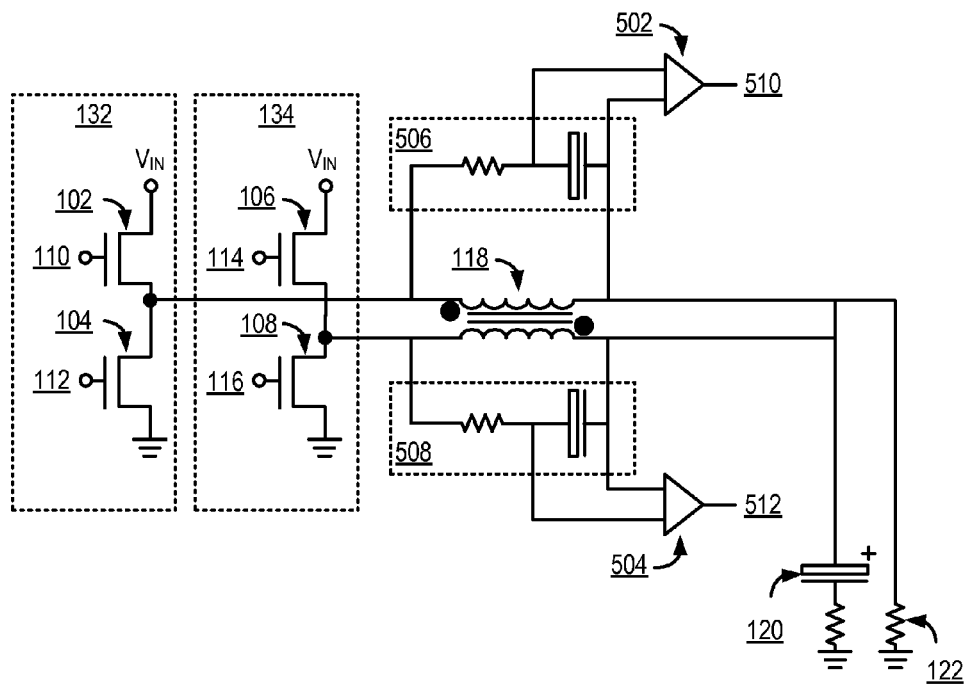
FIG. 5 sets forth a prior art DC-DC converter with current sensing.

For further explanation, FIG. 4 sets forth a flow chart illustrating an example method of operation a DC-DC converter in accordance with embodiments of the present invention. The DC-DC converter of FIG. 4 is similar to the DC-DC converter of FIG. 2A including as it does: a directly coupled inductor (218) that includes a first coil element and a second coil element, the first and second coil elements coupled to an output filter—a capacitor (220)—and a load (222); and a plurality of power-switching phases including a first and second power-switching phase (232), the first power-switching phase (232) including includes a high-side switch (202) and a low-side switch (204), the high-side switch (202) configured, when activated by a control input (210), to couple a voltage source ($V_{IN}$) to the first coil element of the directly coupled inductor (218), the low-side switch (204) configured, when activated by a control input (212), to couple the first coil element to a ground voltage; the second power switching phase (234) also including a high-side switch (206) and a low-side switch (208), the high-side switch (206) configured, when activated by a control input (214), to couple the voltage source ($V_{IN}$) to the second coil element of the directly coupled inductor (218), and the low-side switch (208) configured, when activated by a control input (216), to couple the second coil element to the ground voltage.

The method of FIG. 4 includes alternately activating (402) each switch, where no two switches are activated at the same time. In the method of FIG. 4, alternatively activating (402) each switch is carried out by: activating (404) the high-side switch of the first power-switching phase, including coupling the voltage source to the first coil element, energizing a magnetic core of the directly coupled inductor, and providing, via the first coil element, output current to the filter and load; activating (406) the low-side switch of the first power-switching phase, including coupling the first coil element to the ground voltage and providing, via the second coil element and the energized magnetic core, output current to the filter and load; activating (408) the high-side switch of the second power-switching phase, including coupling the voltage source to the second coil element, re-energizing the magnetic core of the directly coupled inductor, and providing, via the second coil element, output current to the filter and load; and activating (410) the low-side switch of the second power-switching phase, including coupling the second coil element to the ground voltage and providing, via the first coil element and the energized magnetic core, output current to the filter and load.

DC-DC converters configured to operate in accordance with embodiments of the present invention may be implemented in a variety of applications. One application, for example, in which a DC-DC converter configured to operate in accordance with embodiments of the present invention may be implemented, is a power supply for a computer.

In view of the explanations set forth above, readers will recognize that the benefits of operating a DC-DC converter in accordance with embodiments of the present invention include:

reducing a physical footprint of a DC-DC converter without sacrificing efficiency or introducing an inordinate amount of current ripple;
 providing a DC-DC converter having current ripple characteristics independent of leakage inductance;
 providing a DC-DC converter that allows filter capacitance reductions, thereby reducing the need for large physical design layouts;
 providing a DC-DC converter with a coupled inductor that does not rely on flux cancelation of equal current flowing through loop coil elements to improve system performance; and
 providing a DC-DC converter having a coupled inductor in which current flow may be accurately and precisely measured through use of industry standard DCR current sensing.

Although industry standard DCR (Direct current sensing) may be utilized to sense current in the DC-DC converters of 2A and FIG. 3, as explained above, prior art current sensors inefficiently consume power, space, and require a large number of redundant components. To that end, FIG. 6 sets forth an example identity switching DC-DC converter that includes a directly coupled inductor and a current sensor in accordance with embodiments of the present invention.

Figure 6:
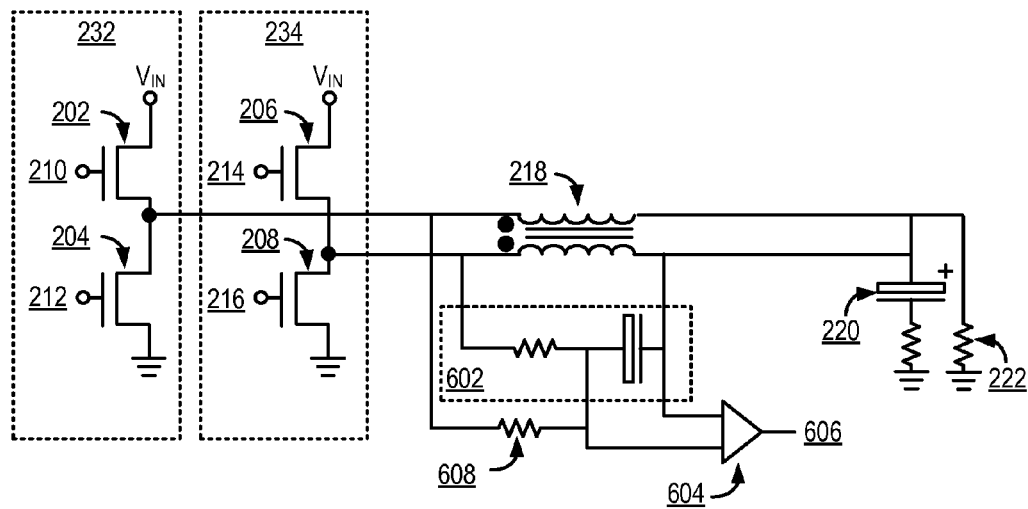
FIG. 6 sets forth an example identity switching DC-DC converter that includes a directly coupled inductor and a current sensor in accordance with embodiments of the present invention.

The DC-DC converter (600) in the example of FIG. 6 is similar to the DC-DC converter in the example of FIG. 2A and includes similar components. Further, the DC-DC converter in the example of FIG. 6 is also operated in a similar manner to that of the DC-DC converter of FIG. 2A. That is, the DC-DC converter of FIG. 6 includes a directly coupled inductor (218) with a plurality of coil elements and a plurality of power-switching phases (232, 234). Each power-switching phase is coupled to a different one of the coil elements. Each phase (232, 234) includes a high-side switch (202, 206) and a low-side switch (204, 208). The high-side switch (202, 206) is configured, when activated through a signal at a control node (210, 214), to couple a voltage source to one of the coil elements and the low-side switch (204, 208) is configured, when activated through another control node (212, 216), to couple the coil element to a ground voltage. The switches of the DC-DC converter (600) are configured to be alternately activated in accordance with the identity switching scheme set forth above such that no two switches of the DC-DC converter (600) are activated at the same time.

The example current sensor of the DC-DC converter (600) includes a single current amplifier (604). That is, in contrast to the prior art DCR current sensors that require a separate current amplifier for each phase of the DC-DC converter, the current sensor in the example of FIG. 6 requires only a single current amplifier for any number of phases. The current amplifier (604) includes plurality of inputs and an output (606).

The output provides a current sensing signal that may be measured to indicate the output current of the DC-DC converter (600).

The example current sensor of the DC-DC converter (600) of FIG. 6 also includes a single RC network ('Resistor-Capacitor network') (602) coupled to one of the power-switching phases. Again, as opposed to the prior art DCR current sensors which require a separate RC network for each and every phase of the DC-DC converter, the current sensor of FIG. 6 requires only a single RC network for a single phase. The RCE network (602) in the example of FIG. 6 is coupled to a first input of the current amplifier (604) and includes a resistor in series with a capacitor.

The example current sensor of the DC-DC converter (600) of FIG. 6 also includes a resistive ladder. The resistive ladder includes: for each of the other power-switching phases (the phases other than the phase which is coupled to the RC network), a resistor coupled in parallel to the resistor of the RC network and coupled to a second input of the current amplifier. A resistive ladder as the term is used here refers to a plurality of resistors in parallel. In the example of FIG. 6, the resistive ladder is formed of the resistor coupled to phase (232) and the resistor of the RC network (602).

Figure 7:
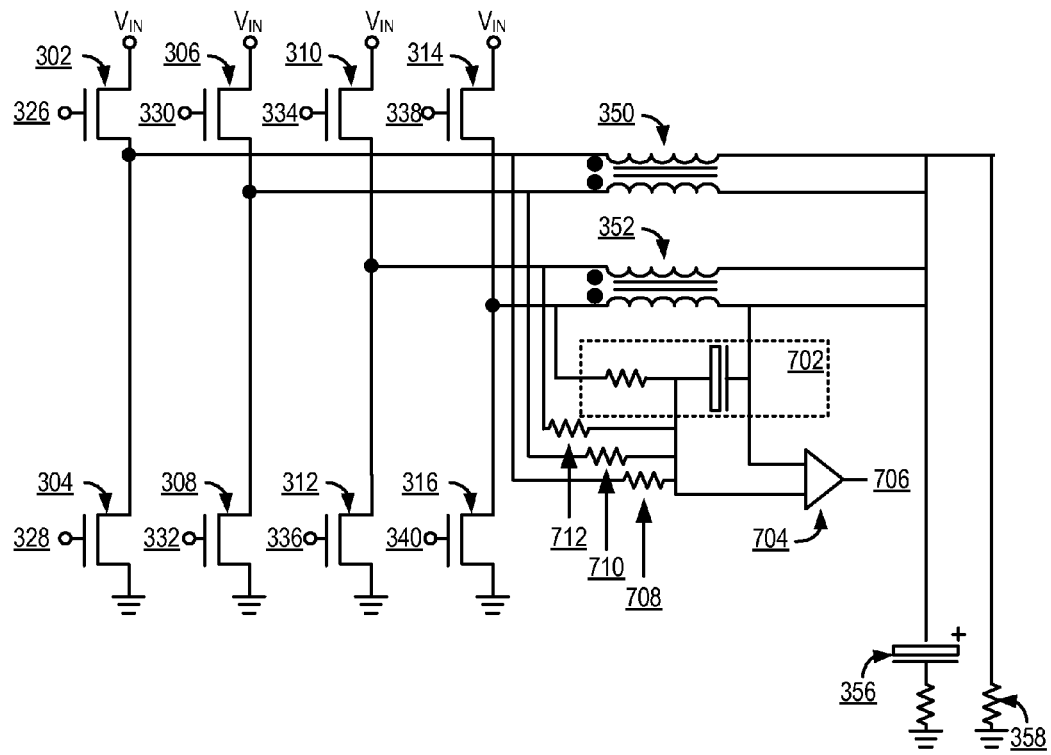
FIG. 7 sets forth an example identity switching DC-DC converter that includes a directly coupled inductor, four power-switching phases, and a current sensor in accordance with embodiments of the present invention.

As mentioned above, the resistive ladder includes resistors for each of the phases of the current sensor. For further explanation, therefore, FIG. 7 sets forth an example identity switching DC-DC converter that includes a directly coupled inductor, four power-switching phases, and a current sensor in accordance with embodiments of the present invention. The example DC-DC converter of FIG. 7 is similar to that of FIG. 4 and includes many of the same components. Further, the example DC-DC converter is operated in a manner similar to that of the DC-DC converter of FIG. 4. That is, the DC-DC converter (700) of FIG. 7 is also operated in accordance with the identity switching schemes set forth above.

The only appreciable difference between the DC-DC converter (700) of FIG. 7 and that of FIG. 4 is that the DC-DC converter (700) of FIG. 7 also includes a current sensor. The current sensor of FIG. 7 includes a single current amplifier (704). The current amplifier includes a plurality of inputs and an output (706). The output provides a current sensing signal which may be measured to indicate current output of the DC-DC converter.

The current sensor in the example of FIG. 7 also includes a single RC network (702) that is coupled to one of the power-switching phases and a first input of the current amplifier (704). The RC network (702) includes a resistor in series with a capacitor.

The example current sensor of the DC-DC converter (700) of FIG. 7 also includes a resistive ladder. The resistive ladder in the example of FIG. 7 includes: for each of the other power-switching phases (the phases not coupled to RC network), a resistor is coupled in parallel to the resistor of the RC network and coupled to a second input of the current amplifier (704). Readers will appreciate that the resistive ladder enables the current sensor to include only a single RC network, a single current amplifier, and a single resistor for every phase (except one). By contrast, the current sensors of the prior art include a current amplifier for every phase and an RC network for every phase.

Figure 8:
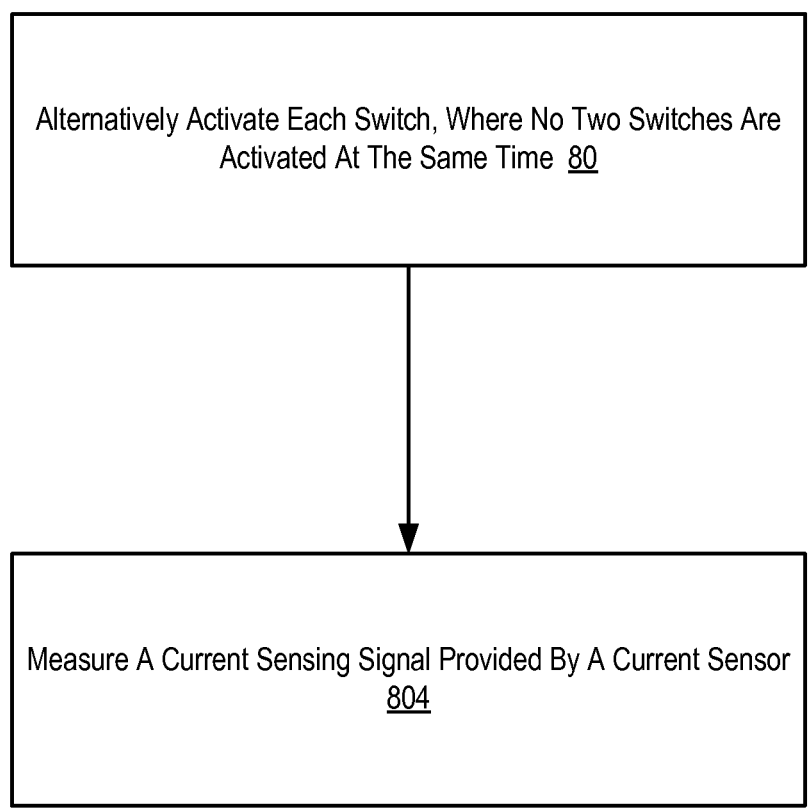
FIG. 8 sets forth a flow chart illustrating an example method of operating a DC-DC converter and sensing current in the DC-DC converter in accordance with embodiments of the present invention.

FIG. 8 sets forth a flow chart illustrating an example method of operating a DC-DC converter and sensing current in the DC-DC converter in accordance with embodiments of the present invention. The method of FIG. 8 may be carried out with a DC-DC converter similar to those set forth in FIG. 6 and FIG. 7. Such a DC-DC converter includes a directly coupled inductor comprising a plurality of coil elements. Such a DC-DC converter also includes a plurality of power-switching phases, with each power-switching phase coupled to a different one of the plurality of coil elements. Each phase also includes: a high-side switch and a low-side switch, where the high-side switch is configured, when activated, to couple a voltage source to one of the coil elements and the low-side switch is configured, when activated, to couple the coil element to a ground voltage.

In the method of FIG. 4, operating such a DC-DC converter is carried out by alternately activating (802) each switch, where no two switches are activated at the same time. That is, the DC-DC converter of FIG. 8 may be operated in accordance with the identity switching scheme set forth above. More specifically, in the method of FIG. 8, alternatively activating (402) each switch is carried out by: activating the high-side switch of a first power-switching phase, including coupling the voltage source to a first coil element, energizing a magnetic core of the directly coupled inductor, and providing, via the first coil element, output current to the filter and load;

activating a low-side switch of the first power-switching phase, including coupling the first coil element to the ground voltage and providing, via a second coil element and the energized magnetic core, output current to the filter and load; activating a high-side switch of a second power-switching phase, including coupling the voltage source to the second coil element, re-energizing the magnetic core of the directly coupled inductor, and providing, via the second coil element, output current to the filter and load; and activating a low-side switch of the second power-switching phase, including coupling the second coil element to the ground voltage and providing, via the first coil element and the energized magnetic core, output current to the filter and load.

The method of FIG. 8 also includes measuring (804) a current sensing signal provided by a current sensor. Such a current sensor may include a single current amplifier having a plurality of inputs and an output, where the output provides the current sensing signal. The current sensor may also include a single RC network coupled to one of the power-switching phases and a first input of the current amplifier, where the RC network includes a resistor in series with a capacitor. The current sensor may also include a resistive ladder. Such a resistive ladder may include, for each of the other power-switching phases, a resistor coupled in parallel to the resistor of the RC network and coupled to a second input of the current amplifier.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A current sensor for a DC ('Direct Current')-DC converter, the DC-DC converter comprising:
   a directly coupled inductor comprising a plurality of coil elements; and
   a plurality of power-switching phases, each power-switching phase coupled to a different one of the plurality of coil elements, each phase comprising: a high-side switch and a low-side switch, wherein the high-side switch is configured, when activated, to couple a voltage source to one of the coil elements and the low-side switch is configured, when activated, to couple the coil element to a ground voltage, wherein each switch of the DC-DC converter is configured to be alternately activated and no two switches are activated at the same time;
   the current sensor comprising:
   a single current amplifier comprising a plurality of inputs and an output, wherein the output provides a current sensing signal;
   a single RC network (Resistor-Capacitor network') coupled to one of the power-switching phases and a first input of the current amplifier, the RC network comprising a resistor in series with a capacitor; and
   a resistive ladder comprising: for each of the other power-switching phases, a resistor coupled in parallel to the resistor of the RC network and coupled to a second input of the current amplifier.

2. The current sensor of claim 1 wherein the DC-DC converter further comprises a filter and a load coupled to the directly coupled inductor and each switch of the DC-DC converter is configured to be alternately activated by:
   activating the high-side switch of a first power-switching phase, including coupling the voltage source to a first coil element, energizing a magnetic core of the directly coupled inductor, and providing, via the first coil element, output current to the filter and load;
   activating the low-side switch of the first power-switching phase, including coupling the first coil element to the ground voltage and providing, via a second coil element and the energized magnetic core, output current to the filter and load;
   activating the high-side switch of a second power-switching phase, including coupling the voltage source to the second coil element, re-energizing the magnetic core of the directly coupled inductor, and providing, via the second coil element, output current to the filter and load; and
   activating the low-side switch of the second power-switching phase, including coupling the second coil element to the ground voltage and providing, via the first coil element and the energized magnetic core, output current to the filter and load.

3. The current sensor of claim 1 wherein each switch of the DC-DC converter is configured to be alternately activated and no two switches are activated at the same time by:
   activating each high-side switch for a period of time according to:

$$\frac{D}{N}$$

where D represents a duty cycle and N represents the number of power-switching phases; and
   activating each low-side switch for a period of time according to:

$$\frac{(1-D)}{N}.$$

4. The current sensor of claim 1 wherein the number of power-switching phases is inversely proportional to the duty cycle of activating the switches and thereby inversely proportional to the inductance of the directly coupled inductor.

5. The current sensor of claim 1 wherein the DC-DC converter further comprises a filter and a load coupled to the directly coupled inductor and current ripple experienced by the filter and the load comprises:

$$\frac{1}{f^*L_{OL}} * \left(1 - \frac{V_{OUT}}{V_{IN}}\right) * \frac{V_{OUT}}{N},$$

where f represents the frequency of alternatively activating each switch, $L_{OL}$ represents the open loop inductance of the directly coupled inductor, N represents the number of power-switching phases, $V_{IN}$ represents the voltage of the voltage source and $V_{OUT}$ represents the voltage experienced at the filter and load.

6. The current sensor of claim 1 wherein each high-side switch and each low-side switch comprises a Field Effect Transistor.

7. A method of sensing current of a DC ('Direct Current')-DC converter, the DC-DC converter comprising:
   a directly coupled inductor comprising a plurality of coil elements; and
   a plurality of power-switching phases, each power-switching phase coupled to a different one of the plurality of coil elements, each phase comprising: a high-side switch and a low-side switch, wherein the high-side switch is configured, when activated, to couple a voltage source to one of the coil elements and the low-side switch is configured, when activated, to couple the coil element to a ground voltage, wherein each switch of the DC-DC converter is configured to be alternately activated and no two switches are activated at the same time; and
   the method comprises:
   measuring a current sensing signal provided by a current sensor, wherein the current sensor comprises:
   a single current amplifier comprising a plurality of inputs and an output, wherein the output provides the current sensing signal;
   a single RC network ('Resistor-Capacitor network') coupled to one of the power-switching phases and a first input of the current amplifier, the RC network comprising a resistor in series with a capacitor; and
   a resistive ladder comprising: for each of the other power-switching phases, a resistor coupled in parallel to the resistor of the RC network and coupled to a second input of the current amplifier.

8. The method of claim 7 wherein the DC-DC converter further comprises a filter and a load coupled to the directly coupled inductor and each switch of the DC-DC converter is configured to be alternately activated by:
  activating the high-side switch of a first power-switching phase, including coupling the voltage source to a first coil element, energizing a magnetic core of the directly coupled inductor, and providing, via the first coil element, output current to the filter and load;
  activating the low-side switch of the first power-switching phase, including coupling the first coil element to the ground voltage and providing, via a second coil element and the energized magnetic core, output current to the filter and load;
  activating the high-side switch of a second power-switching phase, including coupling the voltage source to the second coil element, re-energizing the magnetic core of the directly coupled inductor, and providing, via the second coil element, output current to the filter and load; and
  activating the low-side switch of the second power-switching phase, including coupling the second coil element to the ground voltage and providing, via the first coil element and the energized magnetic core, output current to the filter and load.

9. The method of claim 7 wherein each switch of the DC-DC converter is configured to be alternately activated and no two switches are activated at the same time by:
  activating each high-side switch for a period of time according to:

$$\frac{D}{N}$$

where D represents a duty cycle and N represents the number of power-switching phases; and
  activating each low-side switch for a period of time according to:

$$\frac{(1-D)}{N}.$$

10. The method of claim 7 wherein the number of power-switching phases is inversely proportional to the duty cycle of activating the switches and thereby inversely proportional to the inductance of the directly coupled inductor.

11. The method of claim 7 wherein the DC-DC converter further comprises a filter and a load coupled to the directly coupled inductor and current ripple experienced by the filter and the load comprises:

$$\frac{1}{f \ast L_{OL}} \ast \left(1 - \frac{V_{OUT}}{V_{IN}}\right) \ast \frac{V_{OUT}}{N},$$

where f represents the frequency of alternatively activating each switch, $L_{OL}$ represents the open loop inductance of the directly coupled inductor, N represents the number of power-switching phases, $V_{IN}$ represents the voltage of the voltage source and $V_{OUT}$ represents the voltage experienced at the filter and load.

12. The method of claim 7 wherein each high-side switch and each low-side switch comprises a Field Effect Transistor.

* * * * *